United States Patent [19]
Seely

[11] Patent Number: 6,161,212
[45] Date of Patent: Dec. 12, 2000

[54] SEMICONDUCTOR JUNCTION MODEL AND METHOD FOR USE IN A CIRCUIT MODELING TOOL

[75] Inventor: Warren Leroy Seely, Chandler, Ariz.

[73] Assignee: Motorola, Inc., Schaumburg, Ill.

[21] Appl. No.: 09/128,598

[22] Filed: Aug. 3, 1998

[51] Int. Cl.[7] .................................................. G06F 17/50
[52] U.S. Cl. ..................................... 716/4; 703/2; 703/14
[58] Field of Search ...... 716/1–21; 395/500.02–500.19, 395/500–23, 500.35; 703/2, 14

[56] References Cited

U.S. PATENT DOCUMENTS

| | | | |
|---|---|---|---|
| 5,469,366 | 11/1995 | Yang et al. ................................. | 716/6 |
| 5,535,146 | 7/1996 | Huang et al. .............................. | 703/15 |
| 5,694,052 | 12/1997 | Sawai et al. .............................. | 324/769 |
| 5,757,679 | 5/1998 | Sawai et al. ................................ | 716/4 |
| 5,790,415 | 8/1998 | Pullela et al. ............................... | 716/6 |
| 5,901,063 | 5/1999 | Chang et al. ................................ | 716/4 |
| 5,933,358 | 8/1999 | Koh et al. ................................... | 703/14 |
| 6,066,177 | 5/2000 | Hatsuda .................................... | 703/19 |

OTHER PUBLICATIONS

Kratz ("Dynamic effects in pulse–driven Josephson junctions", IEEE Transactions on Applied Superconductivity, vol. 3, No. 1, Part 4, Mar. 1993, pp. 2653–2657), Mar. 1993.

Whan et al. ("Complex dynamical behavior in RCL–shunted Josephson junctions", IEEE Transactions on Applied Superconductivity, vol. 5, No. 2, Part 3, Jun. 1995, pp. 3094–3097), Jun. 1995.

Robinson et al. ("Base resistance and PN junction capacitance extraction on vertical bipolar transistors", IEEE International Symposium on Circuits and Systems, 1990, vol. 4, May 1, 1990, pp. 3182–3185), May 1990.

Publication, "Modular Series on Solid State Devices"—vol. II—"The PN Junction Diode" (Second Edition), Gerold W. Neudeck, Purdue University, pp. 84–85, 94–97, Published by Addison–Wesley Publishing Company, Inc. Aug. 25, 1988.

*Primary Examiner*—Paul R. Lintz
*Assistant Examiner*—Phallaka Kik
*Attorney, Agent, or Firm*—Gregory J. Gorrie

[57] ABSTRACT

A semiconductor junction (13) is represented as a junction capacitance (21) in parallel with a junction resistance (23) and junction inductance (22). The junction capacitance, junction resistance and junction inductance are functions of the voltage across the semiconductor junction and are determined using a probability of charge stored across the semiconductor junction. Junction parameters are determined with parameter extraction processes. A circuit simulation tool is used to simulate the performance of a circuit that includes the semiconductor junction. Accordingly, diode junctions are more accurately modeled above their built-in potential and below their reverse break-down voltage.

20 Claims, 1 Drawing Sheet

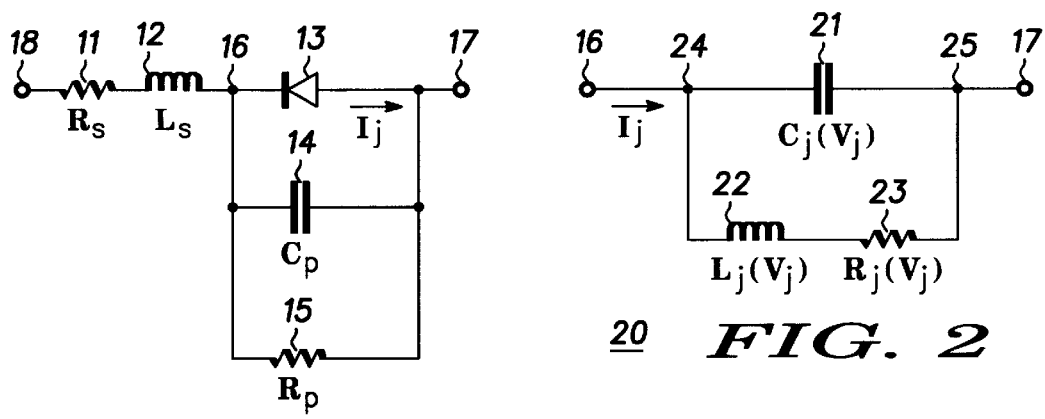
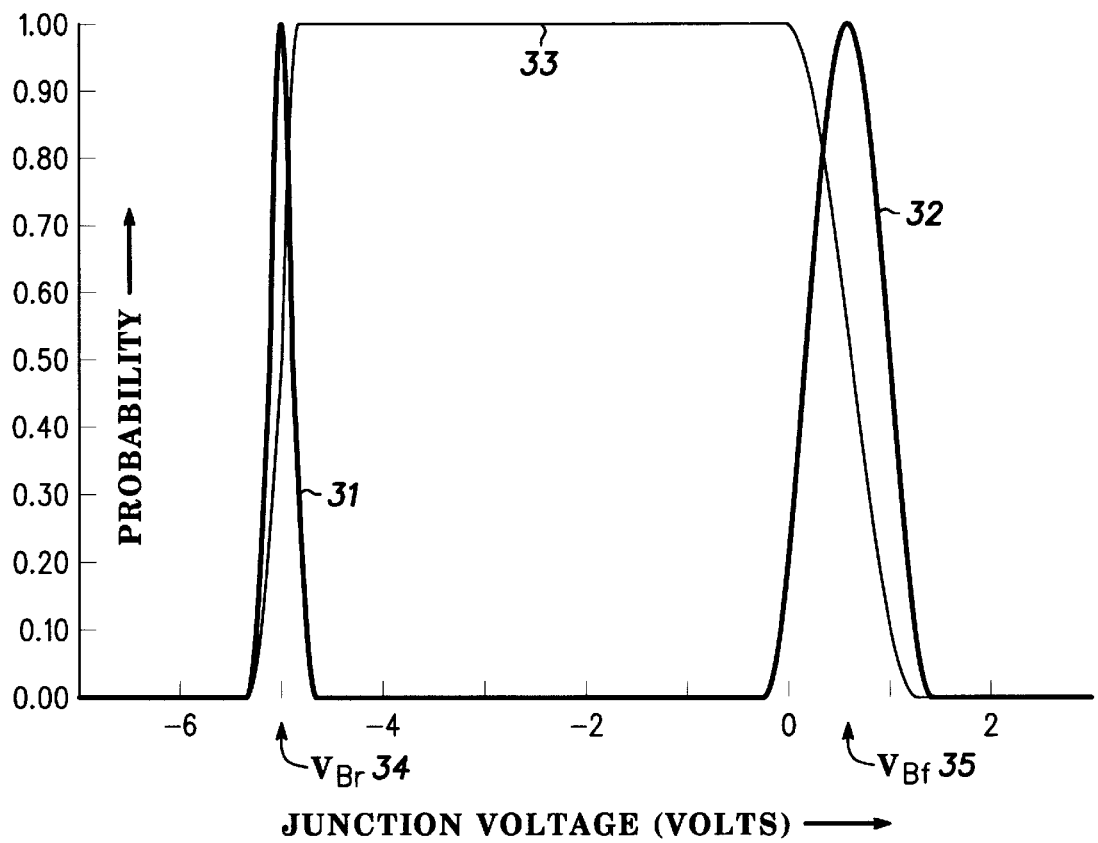

SEMICONDUCTOR JUNCTION MODEL AND METHOD FOR USE IN A CIRCUIT MODELING TOOL

FIELD OF THE INVENTION

This invention relates in general to the field of circuit simulation, in particular to models of semiconductor devices and more particularly to models of semiconductor junctions for use in circuit simulation.

BACKGROUND OF THE INVENTION

Circuit simulation tools are used to predict the performance of a circuit. Circuit simulation tools use models of semiconductor devices to predict the performance of the semiconductor devices within the circuit. Typical semiconductor device models include the parasitic effects of the semiconductor substrate around the semiconductor junction, but do not accurately model the semiconductor junction itself. Diode models, for example, currently in use throughout the semiconductor industry, incorrectly determine the junction capacitance at applied junction voltages above the built-in potential and below the reverse break-down voltage. This results in large signal simulation errors due to incorrect charge distribution and the associated conservation of that charge within the junction. Further, the currently used junction models do not account for the associated variation in junction inductance about the built-in potential and reverse-breakdown. This also leads to large signal simulation errors because the energy stored in the form of magnetic fields and the associated conservation of the magnetic flux is not considered. Under forward conduction well above the built-in potential, and under reverse breakdown well below the reverse breakdown voltage, typical semiconductor junction models incorrectly predict exponential growth of charge carriers and the associated current with increases in applied junction voltage.

Thus what is needed is an improved method for estimating the performance of a semiconductor junction and an improved circuit model that represents a semiconductor junction. What is also needed is a method and circuit model that more accurately predicts the junction capacitance at junction voltages above the built-in potential of the junction and at junction voltages below the reverse break-down voltage of the junction. What is also needed is a method and circuit model that takes into account the charge distribution and the associated conservation of that charge within the junction. What is also needed is a method and circuit model that takes into account variation in junction inductance about the built-in potential and reverse-breakdown. What is also needed is a method and circuit model that takes into account the energy stored in the form of magnetic fields and the associated conservation of the magnetic flux within the semiconductor junction. What is also needed is a method and circuit model with improved large-signal performance predictability. What is also needed is a method and circuit model that more accurately predicts charge carriers and the associated current with increases in applied junction voltage.

What is also needed is an improved circuit simulation tool that more accurately predicts the junction capacitance, junction resistance and junction inductance at junction voltages above the built-in potential of the junction and at junction voltages below the reverse break-down voltage of the junction.

BRIEF DESCRIPTION OF THE DRAWINGS

The invention is pointed out with particularity in the appended claims. However, a more complete understanding of the present invention may be derived by referring to the detailed description and claims when considered in connection with the figures, wherein like reference numbers refer to similar items throughout the figures, and:

FIG. 1 is a model of a semiconductor device that includes substrate parasitics;

FIG. 2 is a simplified model of a semiconductor junction in accordance with a preferred embodiment of the present invention; and FIG. 3 illustrates normalized probability functions for charge across a semiconductor junction as a function of junction voltage.

The exemplification set out herein illustrates a preferred embodiment of the invention in one form thereof, and such exemplification is not intended to be construed as limiting in any manner.

DETAILED DESCRIPTION OF THE DRAWINGS

The present invention provides, among other things an improved method for estimating the performance of a semiconductor junction and an improved circuit model that represents the semiconductor junction. In accordance with the preferred embodiments, the semiconductor junction is represented as a junction capacitance in parallel with a junction resistance and junction inductance. The junction capacitance, junction resistance and junction inductance are functions of the voltage across the semiconductor junction and are determined using a probability of charge stored across the semiconductor junction. Junction parameters are determined with parameter extraction processes. A circuit simulation tool is used to simulate the performance of a circuit that includes the semiconductor junction. Accordingly, diode junctions are more accurately modeled above their built-in potential and below their reverse break-down voltage.

The present invention also provides a method and circuit model that more accurately predicts the junction capacitance at junction voltages above the built-in potential of the junction and at junction voltages below the reverse break-down voltage of the junction. The present invention also provides a method and circuit model that takes into account the charge distribution and the associated conservation of that charge within the junction. The present invention also provides a method and circuit model that takes into account variation in junction inductance about the built-in potential and reverse-breakdown. The present invention also provides a method and circuit model that takes into account the energy stored in the form of magnetic fields and the associated conservation of the magnetic flux within the semiconductor junction. The present invention also provides a method and circuit model with improved large-signal performance predictability. The present invention also provides a method and circuit model that more accurately predicts charge carriers and the associated current with increases in applied junction voltage.

The present invention also provides an improved circuit simulation tool that more accurately predicts the junction capacitance, junction resistance and junction inductance at junction voltages above the built-in potential of the junction and at junction voltages below the reverse break-down voltage of the junction.

FIG. 1 is a model of a semiconductor device that includes substrate parasitics. Semiconductor device model 10 includes resistance ($R_s$) 11 in series with inductance ($L_s$) 12 in series with semiconductor junction 13. Semiconductor device model 10 also includes capacitance ($C_p$) 14 in parallel with resistance ($R_p$) 15 in parallel with junction 13. Resistance 11 is the conductor series parasitic resistance of the semiconductor device model 10. Inductance 12 is the conductor series parasitic inductance of diode model 10. Capacitance 14 is the substrate parallel parasitic capacitance of the substrate around the semiconductor junction of diode model 10. Resistance 15 is the substrate parasitic parallel resistance around the semiconductor junction of diode model 10. Although semiconductor junction 13 is shown as a diode with a forward bias junction for more positive voltages at node 17 than node 16, the present invention is also suitable for any semiconductor junction with either forward-bias or reverse-bias relative orientations.

Device model 10 may be viewed as a complete semiconductor device model that takes into account the effects of the semiconductor substrate. When device model 10 is used in circuit simulation tools, a device voltage is applied across nodes 18 and 17 and a device current flows accordingly. The voltage across the semiconductor junction 13 is the voltage between nodes 16 and 17 and the current through the semiconductor junction is the current that flows from node through junction 13. $R_s$, $L_s$, $R_p$ and $C_p$ are preferably determined experimentally but may also be estimated.

FIG. 2 is a simplified model of a semiconductor junction in accordance with a preferred embodiment of the present invention. Semiconductor junction model 20 represents semiconductor junction 13 (FIG. 1) of semiconductor device 10 (FIG. 1). Model 20 comprises a junction capacitance ($C_j$) 21 in parallel with a junction resistance ($R_j$) 23. In the preferred embodiment, model 20 also comprises a junction inductance ($L_j$) 22 in series with the junction resistance 23 and in parallel with the junction capacitance 21. The junction capacitance 21, the junction resistance 23 and the junction inductance 22 are functions of the junction voltage. The junction voltage ($V_j$) is the voltage potential between nodes 24 and 25 and the junction current ($I_j$) is the current that flows from node 24 to node 25. Nodes 16 and 17 of junction model 20 correspond with nodes 16 and 17 respectively of device model 10 (FIG. 1). The junction capacitance 21, the junction resistance 23 and the junction inductance 22 are each preferably based on a probability of charge stored across the semiconductor junction. Accordingly, the performance of a circuit that includes junction 13 depends on the probability of charge stored across the semiconductor junction.

Junction capacitance ($C_j$) 21 is preferably calculated using the following equation:

$$C_j(V_j) = \frac{C_{jo} P_\pi(V_j)}{\left(1 - \frac{V_j}{V_{Bi} + kV_j P_{Bf}(V_j)_{cum}}\right)^M}$$

wherein:

$V_j$ is the junction voltage across the semiconductor junction;

$C_{jo}$ is a capacitance of the semiconductor junction at $V_j=0$;

$P_\pi(V_j)$ is a cumulative probability of charge stored across the semiconductor junction as a function of the junction voltage;

$V_{Bi}$ is a built in potential of the semiconductor junction;

$P_{Bf}(V_j)cum$ is a cumulative probability of forward conduction charge stored across the semiconductor junction as a function of the junction voltage;

k is a predetermined constant, desirably greater than zero and preferably between one and ten; and M is a junction grading coefficient for the semiconductor junction.

The junction resistance 23 ($R_j$) is preferably calculated using the following equation:

$$R_j(V_j) = R_{jo} P_\pi(V_j) \left(1 - \frac{V_j}{V_{Bi} + kV_j P_{Bf}(V_j)_{cum}}\right)^M$$

wherein $R_{jo}$ is a measured resistance of the semiconductor junction at $V_j=0$. $R_{jo}$ may be a function of the junction voltage depending on the fabrication method and type of semiconduction junction.

The junction inductance 22 ($L_j$) is preferably calculated with the following equation:

$$L_j(V_j) = L_{MaxR} P_{Br}(V_j) + L_{MaxF} P_{Bf}(V_j)$$

wherein:

$P_{Bf}(V_j)$ is a probability function for forward conduction charge stored across the semiconductor junction as a function of the junction voltage;

$P_{Br}(V_j)$ is a probability function for reverse breakdown charge stored across the semiconductor junction as a function of the junction voltage;

$L_{maxR}$ is a reverse breakdown junction inductance when $V_j$ is a reverse breakdown voltage of the semiconductor junction; and $L_{maxF}$ is a forward junction inductance when $V_j$ is a built-in potential of the semiconductor junction.

FIG. 3 illustrates normalized probability functions for charge across a semiconductor junction as a function of junction voltage. Probability function 31 ($P_{Br}(V_j)$) is a normalized probability function for reverse breakdown charge stored across the semiconductor junction as a function of the junction voltage. Probability function 32 ($P_{Bf}(V_j)$) is a normalized probability function for forward conduction charge stored across the semiconductor junction as a function of the junction voltage. Voltage 34 is the reverse bias breakdown voltage for the semiconductor junction. Voltage 35 is the forward bias voltage for the semiconductor junction. Although FIG. 3 illustrates voltages which are typical for silicon semiconductor junctions of N-type doping on P-type substrates, or vice-versa, other dopings and substrates, and other material semiconductor junctions including Gallium Arsenide (GaAs) are equally suitable for use with the present invention.

Probability function 33 ($P_\pi(V_j)$) is a cumulative probability of charge stored across the semiconductor junction as a function of the junction voltage, and includes charge resulting from both forward conduction and reverse breakdown. $P_\pi(V_j)$ is preferably calculated using the following equation:

$$P_\pi(V) = P_{Br}(V)_{cum}(1 - P_{Bf}(V)_{cum})$$

$P_{Bfcum}(V_j)$ is a cumulative probability of forward conduction charge stored across the semiconductor junction as a function of the junction voltage. $P_{Brcum}(V_j)$ is a cumulative probability of reverse breakdown charge stored across the semiconductor junction as a function of the junction voltage. To determine the cumulative probabilities, $P_{Bfcum}(V_j)$ and $P_{Brcum}(V_j)$, the probability functions are integrated from negative infinity to the junction voltage to determine the total charge stored about the semiconductor junction. For example, $P_{Bfcum}(V_j)$ and $P_{Brcum}(V_j)$ may be calculated as follows:

$$P_{Bf}(V)_{cum} = \int_{-\infty}^{v_j} P_{Bf}(V)dv$$

$$P_{Br}(V)_{cum} = \int_{-\infty}^{v_j} P_{Br}(V)dv$$

The probability functions $P_{Bf}(V_j)$ and $P_{Br}(V_j)$ are typical probability functions each having a mean value and a distribution ($\sigma$). In the preferred embodiment, Gaussian probability functions are used. In other embodiments of the present invention, the probability function used depends on the way the semiconductor is formed as well as the type of semiconductor material. The mean value for probability function $P_{Bf}(V_j)$ is the forward conduction voltage ($V_{Bf}$) (built-in potential) of the semiconductor junction, and the mean value for probability function $P_{Br}(V_j)$ is the reverse breakdown voltage ($V_{Br}$) of the semiconductor junction. $V_{Bf}$ and $V_{Br}$ may be determined experimentally or may be approximated from known characteristics of the semiconductor junction. For silicon junctions, $V_{Bf}$ is typically around 0.6 volts and $V_{Br}$ is typically around $-15.0$ volts. The charge distributions ($\sigma$) are determined experimentally. The forward bias charge distribution $\sigma_{Bf}$ is typically on the order 0.30 and the reverse bias charge distribution $\sigma_{Br}$ is typically on the order 0.10 for silicon semiconductor junctions. The forward bias and reverse bias charge distributions are preferably determined experimentally on an actual semiconductor junction such as a diode.

$L_{max}$ and $L_{maxF}$ are preferably determined experimentally and determined from a combination of the junction capacitance and reactance curves of the semiconduction junction. $L_{maxR}$ is typically on the order of 1.5 nH and $L_{maxF}$ is typically on the order of 0.9 nH for silicon semiconductor junctions.

Thus, a semiconductor junction model and method has been described which overcomes specific problems and accomplishes certain advantages relative to prior art methods and mechanisms. The improvements over known technology are significant. For example, the method and model for the semiconductor junction predicts exponential carrier relationships up to and just beyond the built-in potential and reverse breakdown voltages and transitions to substantially linear relationships thereafter due to parasitic effects of the extrinsic model (e.g., model 10 of FIG. 1) resulting in improved prediction capability for large signal applications. The model and method of the present invention is based on actual diode physical parameters, which are either calculated or measured and parameter extracted. The model and method of the present invention account for the operation of the semiconductor junction from forward burnout to reverse burnout using physically based derivations and physical parameters that are determined by measurement. The model and method of the present invention includes a junction inductance provided for improved simulations, especially for performance of Nth order intermodulation products.

The foregoing description of the specific embodiments will so fully reveal the general nature of the invention that others can, by applying current knowledge, readily modify and/or adapt for various applications such specific embodiments without departing from the generic concept, and therefore such adaptations and modifications should and are intended to be comprehended within the meaning and range of equivalents of the disclosed embodiments.

It is to be understood that the phraseology or terminology employed herein is for the purpose of description and not of limitation. Accordingly, the invention is intended to embrace all such alternatives, modifications, equivalents and variations as fall within the spirit and broad scope of the appended claims.

What is claimed is:

1. A method for estimating performance of a circuit that includes a semiconductor device, the semiconductor device comprising a semiconductor junction, the method comprising the steps of:

selecting a model for the semiconductor junction from one of a plurality of semiconductor junction models to identify a probability of charge distributed across the selected semiconductor junction, the probability of charge being a function of a junction voltage ($V_j$) across the selected semiconductor junction;

representing the semiconductor junction as a junction capacitance ($C_j$) in parallel with a junction resistance ($R_j$);

calculating the junction capacitance based on said probability of charge for said selected semiconductor junction, said junction capacitance being a function of the junction voltage ($V_j$) across the selected semiconductor junction; and using the junction capacitance in a circuit simulation tool to produce an output performance of the circuit.

2. A method for estimating the performance of the circuit as claimed in claim 1 wherein said probability of charge distribution for the selected semiconductor junction is based on experimental data, and wherein the method further comprising the steps of:

calculating the junction resistance ($R_j$) as a function of the junction voltage ($V_j$) using the probability of charge distribution across the selected semiconductor junction; and calculating a junction current ($I_j$) using the junction voltage ($V_j$) and the junction resistance ($R_j$), and wherein the using step includes the step of using both the junction current ($I_j$) and the junction capacitance ($C_j$) in the circuit simulation tool to determine the performance of the circuit.

3. A method for estimating the performance of the circuit as claimed in claim 2 wherein the representing step further comprises the step of representing the semiconductor junction with a junction inductance ($L_j$) in series with the junction resistance ($R_j$), wherein the junction resistance and junction inductance are in parallel with the junction capacitance, and the junction inductance ($L_j$) is a function of the junction voltage ($V_j$) and the probability of charge stored across the semiconductor junction, and wherein the using step further includes the step of using the junction current ($I_j$), the junction capacitance ($C_j$) and the junction inductance ($L_j$) in the circuit simulation tool to determine the performance of the circuit.

4. A method for estimating performance of a circuit that includes a semiconductor device, the semiconductor device comprising a semiconductor junction, the method comprising the steps of:

representing the semiconductor junction as a junction capacitance ($C_j$) in parallel with a junction resistance ($R_j$);

calculating the junction capacitance as a function of a junction voltage ($V_j$) across the semiconductor junction; and using the junction capacitance in a circuit simulation tool to produce an output performance of the circuit, wherein the junction capacitance is based on a probability of charge stored across the semiconductor junction;

calculating the junction resistance ($R_j$) as a function of the junction voltage ($V_j$) using the probability of charge stored across the semiconductor junction; and calculating a junction current ($I_j$) using the junction voltage ($V_j$) and the junction resistance ($R_j$), and wherein the using step includes the step of using both the junction current ($I_j$) and the junction capacitance ($C_j$) in the circuit simulation tool to produce said output performance of the circuit, wherein the calculating the junction capacitance step comprises the step of calculating the junction capacitance using the following equation:

$$C_j(V_j) = \frac{C_{jo} P_\pi(V_j)}{\left(1 - \frac{V_j}{V_{Bi} + kV_j P_{Bf}(V_j)_{cum}}\right)^M}$$

wherein:

$V_j$ is the junction voltage across the semiconductor junction;

$C_{jo}$ is a capacitance of the semiconductor junction at $V_j=0$;

$P_\pi(V_j)$ is a cumulative probability of charge stored across the semiconductor junction as a function of the junction voltage;

$V_{Bi}$ is a built in potential of the semiconductor junction;

$P_{Bf}(V_j)_{cum}$ is a cumulative probability of forward conduction charge stored across the semiconductor junction as a function of the junction voltage;

k is a predetermined constant; and

M is a junction grading coefficient for the semiconductor junction.

5. A method for estimating the performance of the circuit as claimed in claim 4 further comprising the step of measuring a resistance of the semiconductor junction at $V_j=0$ wherein the calculating the junction resistance step comprises the step of calculating the junction resistance using the following equation:

$$R_j(V_j) = R_{jo} P_\pi(V_j) \left(1 - \frac{V_j}{V_{Bi} + kV_j P_{Bf}(V_j)_{cum}}\right)^M$$

wherein $R_{jo}$ is the measured resistance of the semiconductor junction at $V_j=0$.

6. A method for estimating the performance of the circuit as claimed in claim 5 further comprising the step of representing the semiconductor device with:

a conductor series parasitic resistance ($R_s$) in series with a conductor series parasitic inductance ($L_s$); and a substrate parallel parasitic capacitance ($C_p$) in parallel with a substrate parallel parasitic resistance ($R_p$), and wherein the semiconductor junction is in parallel with the substrate parallel parasitic inductance and capacitance, and wherein the using step includes the step of using the substrate series parasitic resistance ($R_s$) and inductance ($L_s$) and the substrate parallel parasitic capacitance ($C_p$) and resistance ($R_p$) in the circuit simulation tool to determine the performance of the circuit.

7. A method for estimating the performance of the circuit as claimed in claim 6 wherein the semiconductor device includes a Gallium Arsenide (GaAs) substrate, and wherein the semiconductor junction comprises a interface of semiconductor material of differing doping.

8. A method for estimating the performance of the circuit as claimed in claim 7 wherein the circuit simulation tool comprises a software program, and wherein the using step includes the step of programming a computer with the software program to use the junction capacitance to produce the output performance of the circuit.

9. A method for estimating performance of a circuit that includes a semiconductor device, the semiconductor device comprising a semiconductor junction, the method comprising the steps of:

representing the semiconductor junction as a junction capacitance ($C_j$) in parallel with a junction resistance ($R_j$);

calculating the junction capacitance as a function of a junction voltage ($V_j$) across the semiconductor junction; and using the junction capacitance in a circuit simulation tool to produce an output performance of the circuit, wherein the junction capacitance is based on a probability of charge stored across the semiconductor junction;

calculating the junction resistance ($R_j$) as a function of the junction voltage ($V_j$) using the probability of charge stored across the semiconductor junction; and calculating a junction current ($I_j$) using the junction voltage ($V_j$) and the junction resistance ($R_j$), and wherein the using step includes the step of using both the junction current ($I_j$) and the junction capacitance ($C_j$) in the circuit simulation tool to produce the output performance of the circuit, wherein the representing step further comprises the step of representing the semiconductor junction with a junction inductance ($L_j$) in series with the junction resistance ($R_j$), wherein the junction resistance and junction inductance are in parallel with the junction capacitance, and the junction inductance ($L_j$) is a function of the junction voltage ($V_j$) and the probability of charge stored across the semiconductor junction, and wherein the using step further includes the step of using the junction current ($I_j$), the junction capacitance ($C_j$) and the junction inductance ($L_j$) in the circuit simulation tool to determine the performance of the circuit, wherein the method further comprises the step of calculating the junction inductance ($L_j$) with the following equation:

$$L_j(V_j) = L_{MaxR} P_{Br}(V_j) + L_{MaxF} P_{Bf}(V_j)$$

wherein:

$P_{Bf}(V_j)$ is a probability function for forward conduction charge stored across the semiconductor junction as a function of the junction voltage;

$P_{Br}(V_j)$ is a probability function for reverse breakdown charge stored across the semiconductor junction as a function of the junction voltage;

$L_{maxR}$ is a reverse breakdown junction inductance when $V_j$ is a reverse breakdown voltage of the semiconductor junction; and $L_{maxF}$ is a forward junction inductance when $V_j$ is a built-in potential of the semiconductor junction.

10. A method for estimating junction current ($I_j$) through a semiconductor junction as a function of junction voltage ($V_j$), the method comprising the steps of:

selecting a model for the semiconductor junction from one of a plurality of semiconductor junction models to identify a probability of charge distribution across the selected semiconductor junction, the probability of charge distribution being a function of a junction voltage ($V_j$) across the selected semiconductor junction;

representing the semiconductor junction as a junction capacitance ($C_j$) in parallel with a junction resistance ($R_j$);

calculating the junction capacitance ($C_j$) and junction resistance ($R_j$) as a function of the junction voltage ($V_j$) using the probability of charge distribution across the selected semiconductor junction;

estimating the junction current ($I_j$) through the semiconductor junction as a function of the junction voltage ($V_j$) and the junction resistance ($R_j$); and using the junction current ($I_j$) and junction capacitance ($C_j$) in a circuit simulation tool to produce an output performance for a circuit within which the semiconductor junction is part of.

11. A method as claimed in claim 10 wherein the semiconductor junction is within a semiconductor device, and wherein the semiconductor device is part of said circuit.

12. A method as claimed in claim 11 wherein the representing step further comprises the step of representing the semiconductor junction with a junction inductance ($L_j$) in series with the junction resistance ($R_j$), wherein the junction resistance and junction inductance are in parallel with the junction capacitance, and the junction inductance ($L_j$) is a function of the junction voltage ($V_j$) and the probability of charge distribution across the semiconductor junction, and wherein the using step further includes the step of using the junction current ($I_j$), the junction capacitance ($C_j$) and the junction inductance ($L_j$) in the circuit simulation tool to provide the output performance of the circuit.

13. A method for estimating junction current ($I_j$) through a semiconductor junction as a function of junction voltage ($V_j$), the method comprising the steps of:

representing the semiconductor junction as a junction capacitance ($C_j$) in parallel with a junction resistance ($R_j$);

calculating the junction capacitance ($C_j$) and junction resistance ($R_j$) using the junction voltage ($V_j$) and a probability of charge stored across the semiconductor junction;

estimating the junction current ($I_j$) through the semiconductor junction as a function of the junction voltage ($V_j$) and the junction resistance ($R_j$), wherein the semiconductor junction is within a semiconductor device, and wherein the semiconductor device is part of a circuit; and using the junction current ($I_j$) and junction capacitance ($C_j$) in a circuit simulation tool to provide an output performance of the circuit, wherein the representing step further comprises the step of representing the semiconductor junction with a junction inductance ($L_j$) in series with the junction resistance ($R_j$), wherein the junction resistance and junction inductance are in parallel with the junction capacitance, and the junction inductance ($L_j$) is a function of the junction voltage ($V_j$) and the probability of charge stored across the semiconductor junction, and wherein the using step further includes the step of using the junction current ($I_j$), the junction capacitance ($C_j$) and the junction inductance ($L_j$) in the circuit simulation tool to provide the output performance of the circuit, wherein the method further comprises the steps of calculating the junction capacitance ($C_j$) and junction resistance ($R_j$) with the following equations:

$$C_j(V_j) = \frac{C_{jo} P_\pi(V_j)}{\left(1 - \frac{V_j}{V_{Bi} + kV_j P_{Bf}(V_j)_{cum}}\right)^M}$$

$$R_j(V_j) = R_{jo} P_\pi(V_j) \left(1 - \frac{V_j}{V_{Bi} + kV_j P_{Bf}(V_j)_{cum}}\right)^M$$

wherein:

$V_j$ is the junction voltage across the semiconductor junction;

$C_{jo}$ is a capacitance of the semiconductor junction at $V_j=0$;

$P_\pi(V_j)$ is a cumulative probability of charge stored across the semiconductor junction as a function of the junction voltage;

$V_{Bi}$ is a built in potential of the semiconductor junction;

$P_{Bf}(V_j)$cum is a cumulative probability of forward conduction charge stored across the semiconductor junction as a function of the junction voltage;

k is a predetermined constant;

M is a junction grading coefficient for the semiconductor junction; and $R_{jo}$ is a measured resistance of the semiconductor junction at Vj=0.

14. A circuit embodied in a memory of a computer as part of a computer program, the circuit representing a semiconductor junction, the circuit comprising:

a junction capacitance ($C_j$); and a junction resistance ($R_j$) in parallel with the junction capacitance, wherein the junction capacitance ($C_j$) and the junction resistance ($R_j$) are a function of a voltage ($V_j$) across the semiconductor junction and determined based on a probability of charge distributed across the semiconductor junction, wherein the computer program includes a circuit simulation tool determines the junction capacitance and junction resistance to determine a junction current to produce an output of the circuit.

15. A circuit as claimed in claim 14 further comprising a junction inductance ($L_j$) in series with the junction resistance ($R_j$), the junction inductance ($L_j$) being a function of the probability of charge distributed across the semiconductor junction, and wherein the circuit simulation tool further uses the junction inductance to determine the junction current to provide the output of the circuit.

16. A circuit for representing a semiconductor junction as a function of voltage ($V_j$) across the semiconductor junction as part of a circuit simulation tool, the circuit comprising:

a junction capacitance ($C_j$); and a junction resistance ($R_j$) in parallel with the junction capacitance, wherein the junction capacitance ($C_j$) and the junction resistance ($R_j$) are functions of a probability of charge stored across the semiconductor junction;

a junction inductance ($L_j$) in series with the junction resistance ($R_j$), the junction inductance ($L_j$) being a function of the probability of charge stored across the semiconductor junction, wherein the junction current ($I_j$), the junction capacitance ($C_j$) and the junction inductance ($L_j$) are used in the circuit simulation tool to provide a output performance of the circuit, wherein the junction capacitance ($C_j$), the junction resistance ($R_j$) and the junction inductance ($L_j$) are calculated with the following equations:

$$C_j(V_j) = \frac{C_{jo} P_\pi(V_j)}{\left(1 - \frac{V_j}{V_{Bi} + kV_j P_{Bf}(V_j)_{cum}}\right)^M}$$

$$R_j(V_j) = R_{jo} P_\pi(V_j) \left(1 - \frac{V_j}{V_{Bi} + kV_j P_{Bf}(V_j)_{cum}}\right)^M$$

wherein:

$V_j$ is the junction voltage across the semiconductor junction;

$C_{jo}$ is a capacitance of the semiconductor junction at $V_j=0$;

$P_\pi(V_j)$ is a cumulative probability of charge stored across the semiconductor junction as a function of the junction voltage;

$V_{Bi}$ is a built in potential of the semiconductor junction;

$P_{Bf}(V_j)cum$ is a cumulative probability of forward conduction charge stored across the semiconductor junction as a function of the junction voltage;

k is a predetermined constant;

M is a junction grading coefficient for the semiconductor junction; and $R_{jo}$ is a measured resistance of the semiconductor junction at $V_j=0$.

17. A circuit as claimed in claim 16 wherein the junction inductance (Lj) is calculated with the following equation:

$$L_j(V_j) = L_{MaxR} P_{Br}(V_j) + L_{MaxF} P_{Bf}(V_j)$$

wherein:

$P_{Bf}(V_j)$ is a probability function for forward conduction charge stored across the semiconductor junction as a function of the junction voltage;

$P_{Br}(V_j)$ is a probability function for reverse breakdown charge stored across the semiconductor junction as a function of the junction voltage;

$L_{maxR}$ is a reverse breakdown junction inductance when $V_j$ is a reverse breakdown voltage of the semiconductor junction; and $L_{maxF}$ is a forward junction inductance when $V_j$ is a built-in potential of the semiconductor junction.

18. A circuit as claimed in claim 17 further comprising a representation of a semiconductor device that includes the semiconductor junction, the representation of the semiconductor device comprising:

a substrate series parasitic resistance ($R_s$) in series with a substrate series parasitic inductance ($L_s$); and a substrate parallel parasitic capacitance ($C_p$) in parallel with a substrate parallel parasitic resistance ($R_p$), and wherein the semiconductor junction is in parallel with the substrate parallel parasitic inductance and capacitance.

19. A circuit as claimed in claim 18 further comprising a Gallium Arsenide (GaAs) substrate that includes the semiconductor device.

20. A circuit simulation tool comprised of software that operates on a computer as part of a computer program, the circuit simulation tool representing a semiconductor junction comprised of:

a junction capacitance ($C_j$);

a junction resistance ($R_j$) in parallel with the junction capacitance; and a junction inductance ($L_j$) in series with the junction resistance ($R_j$), wherein a model for the semiconductor junction is selected from one of a plurality of semiconductor junction models to identify a probability of charge distributed across the selected semiconductor junction, the probability of charge being a function of a junction voltage ($V_j$) across the selected semiconductor junction;

wherein the computer program causes the computer to calculate the junction capacitance ($C_j$), the junction resistance ($R_j$), and the junction inductance ($L_j$) as a function of the junction voltage using the probability of charge distributed across the semiconductor junction and uses the representation of the semiconductor junction as part of transistor in a circuit to output performance data for the circuit.

* * * * *